United States Patent [19]

Yahara

[11] Patent Number: 4,943,841
[45] Date of Patent: Jul. 24, 1990

[54] WIRING STRUCTURE FOR SEMICONDUCTOR INTEGRATED CIRCUIT DEVICE

[75] Inventor: Toshihiko Yahara, Hyogo, Japan

[73] Assignee: Mitsubishi Denki Kabushiki Kaisha, Tokyo, Japan

[21] Appl. No.: 256,087

[22] Filed: Oct. 6, 1988

Related U.S. Application Data

[63] Continuation of Ser. No. 103,643, Oct. 2, 1987, abandoned.

[30] Foreign Application Priority Data

Oct. 20, 1986 [JP] Japan .................. 63-250104

[51] Int. Cl.$^5$ .............. H01L 27/10; H01L 27/15; H01L 23/48; H01L 29/54
[52] U.S. Cl. .................................. 357/45; 357/68; 357/71
[58] Field of Search .............. 357/68, 71, 45

[56] References Cited

U.S. PATENT DOCUMENTS

| | | | |
|---|---|---|---|
| 4,568,961 | 2/1986 | Noto | 357/68 |
| 4,673,966 | 6/1987 | Shimoyama | 357/68 |
| 4,689,654 | 8/1987 | Brockmann | 357/71 R |
| 4,689,657 | 8/1987 | Percival et al. | 357/68 |
| 4,716,308 | 12/1987 | Matsuo et al. | 357/45 |
| 4,825,273 | 4/1989 | Arakawa | 357/45 |

FOREIGN PATENT DOCUMENTS

| | | | |
|---|---|---|---|
| 0247950 | 12/1985 | Japan | 357/71 |
| 2122809 | 1/1984 | United Kingdom | 357/45 M |
| 2137413 | 10/1984 | United Kingdom . | |

OTHER PUBLICATIONS

Balyoz et al., "Densified Wiring Channels Design Concept", IBM Technical Disclosure Bulletin, vol. 17, No. 7, Dec. 1974, pp. 1958-1959.

Primary Examiner—Eugene R. LaRoche
Assistant Examiner—Michael B. Shingleton
Attorney, Agent, or Firm—Nixon & Vanderhye

[57] ABSTRACT

A wiring structure for a semiconductor integrated circuit device having a common wiring region such as a gate array comprises a lower wiring layer formed on a semiconductor substrate with a predetermined lattice form and an upper wiring layer formed on an insulating film on the lower layer with a lattice form orthogonal to the lower lattice. The wiring lattice of the lower wiring layer is cut at intermediate portions thereof between the wiring lattices of the upper wiring layer into segments, ends of the segments being exposed through through-holes perforated in the insulating film in portion thereof except crossing points of the upper and lower wiring lattices. Predetermined through-holes are buried with a connecting wiring having a predetermined pattern at the time of forming the wiring lattice of the upper wiring layer to connect the upper layer to the lower layer and are buried with discretely provided connecting wirings to connect the segments to each other. Since the wiring structure can be formed by the single step wiring processing to a semicustomized LSI having a common region such as gate array, the number of photomasks is minimized for customization of the semicustomized LSI.

7 Claims, 3 Drawing Sheets

WIRING STRUCTURE FOR SEMICONDUCTOR INTEGRATED CIRCUIT DEVICE

This is a continuation of application Ser. No. 103,643, filed Oct. 2, 1987, now abandoned.

BACKGROUND OF THE INVENTION

The present invention relates to a wiring structure for a semiconductor integrated circuit device. More particularly, the invention relates to improvements in a multilayer wiring structure for a semiconductor integrated circuit device having a fixed wiring region such as a gate array.

A two layer metal wiring structure is shown as a conventional wiring structure of a semiconductor integrated circuit device of this type in FIGS. 1 and 2. FIG. 1 is a plan view of the two layer metal wiring structure, and FIG. 2 is a sectional view taken along the line II—II of FIG. 1.

In the conventional two layer metal wiring structure shown in FIGS. 1 and 2, reference numeral 1 depicts a semiconductor substrate of a semiconductor integrated circuit, numeral 2 denotes a first insulating layer in the form of silicon oxide or silicon nitride film formed on the semiconductor substrate 1, numeral 3 designates a first metal wiring layer of aluminum formed on the first insulating film layer 2 with a predetermined pattern, numeral 4 indicates a second insulating film layer of silicon oxide or silicon nitride on the first metal wiring layer 3, and numeral 5 illustrates a second metal wiring layer of aluminum formed on the second insulating film layer 4 and connected to the first metal wiring layer 3 via through holes 6 at a predetermined portions thereof.

In the two layer metal wiring structure of this conventional example, the first insulating film layer 2 is first formed on the semiconductor substrate 1, and contact holes are perforated in the first insulating film layer 2 by a photoresist technique generally to form contacts with terminals of circuit elements such as transistors formed in the main surface of the semiconductor substrate 1 (though omitted in the drawings).

Then, after wiring metal is formed on the entire surface of the wafer by bonding, the first metal wiring layer 3 is formed thereon in a predetermined pattern by a photoresist technique. The second insulating film layer 4 for covering them is further formed thereon and through holes 6 are also perforated in the second insulating film layer 4 by a photoresist technique to form contacts with the first metal wiring layer 3. Wiring metal is subsequently formed by bonding to cover the entire surface thereof and the second metal wiring layer 5 is formed by patterning it as predetermined by a photoresist technique. Thereafter, the first and second layer metal wirings 3 and 5 are connected to one another.

Therefore, in the two layer metal wiring structure of each such conventional semiconductor integrated circuit device, at least four photoresist steps must be executed with using four different photomasks in the respective steps. As the result, there arise drawbacks that a development cost of the semiconductor integrated circuit of this type is increased since the photomasks are expensive and wafer processing time is lengthened. These drawbacks cause a small quantity production of various products within short period which is usual in production of semicustomed LSI having common region such as gate arrays to be largely disturbed.

SUMMARY OF THE INVENTION

The present invention contemplates eliminating such drawbacks in a multilayered wiring structure of a conventional semiconductor integrated circuit device. An object of the present invention is to provide wiring structure semicustomized semiconductor integrated circuit devices having common regions such as gate arrays, in which the number of customized photomasks used in forming wirings for customizing such semicustomized LSIs is reduced.

According to the present invention, semicustomized semiconductor integrated circuit wafers each comprising a substrate, a first insulating layer thereon, a first wiring metal layer and a second insulating layer thereon are preliminarily prepared. By forming various second wiring metal layers thereon, they are then customized. That is, a multilayered wiring structure of a semiconductor integrated circuit device, which includes stationary wiring regions such as gate arrays, comprises the first lower wiring layer formed on the substrate with a predetermined lattice pattern and an upper wiring layer formed on the first insulating film on the first wiring layer with a predetermined lattice pattern orthogonal to the first layer. The wiring lattices of the lower layer wiring are individually cut away at intermediate portions between the wiring lattices of the upper layer wiring to form segments, and opposing cut ends of adjacent segments of the lower layer wiring lattices are exposed by through holes formed in the insulating film at portions other than crossing points of both the wiring lattices. Predetermined through-holes are filled with connecting wirings at the time of forming the second wiring layer wiring to make desired connection between the wirings of the upper lower end and the lower layer, and between the segments.

Predetermined ones of the through-holes are buried at the time of forming the wiring lattice of the upper wiring layer by predetermined connecting wirings connected to the wiring lattice of the second (upper) wiring layer to connect the upper layer to the lower layer. Other through-holes are buried by predetermined independently formed and floating connecting wirings to mutually connect the exposed ends of the segments of the lower wiring layer therebetween. This predetermined customized wiring can be formed only by one photomask.

DETAILED DESCRIPTION OF THE PREFERRED EMBODIMENTS

An embodiment of a wiring structure for a semiconductor integrated circuit device according to the present invention will be described in detail with reference to FIGS. 3 to 8.

Figure 3:
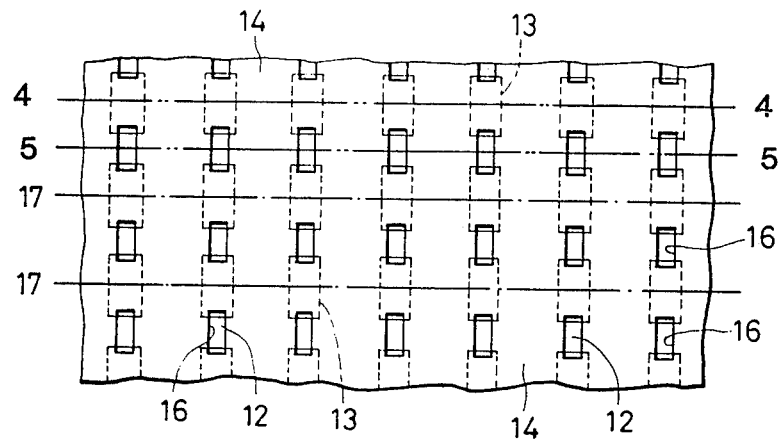
FIG. 3 is a plan view of an embodiment of a wiring structure for a semiconductor integrated circuit device according to the present invention.
Figure 4:
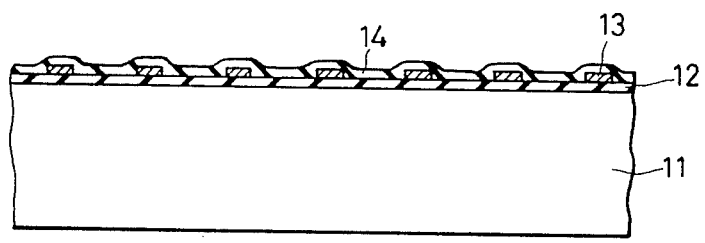
FIGS. 4 and 5 are sectional views taken along the lines IV—IV and V—V in FIG. 3, showing the states before forming the second metal wiring layer, respectively.
Figure 5:
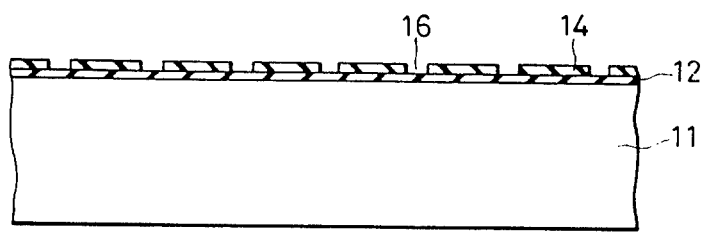
Figure 6:
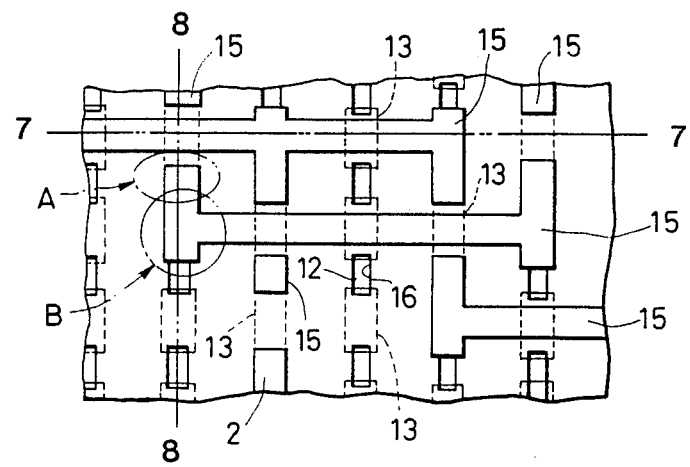
FIG. 6 is a plan view showing the state after the second layer metal wiring is completed.
Figure 7:
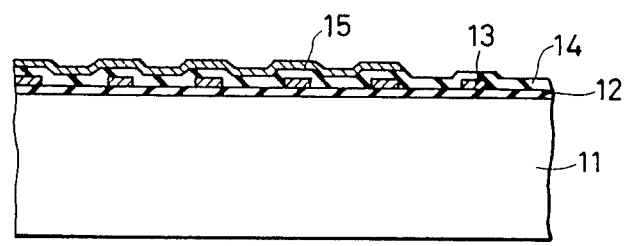
FIGS. 7 and 8 are sectional views taken along the lines VII—VII and VIII—VIII in FIG. 6, respectively.
Figure 8:
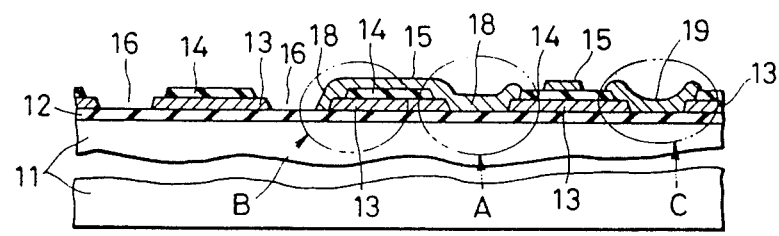

FIG. 3 is a plan view of an embodiment of a wiring structure for a semiconductor integrated circuit device according to the present invention, FIGS. 4 and 5 are sectional views taken along the lines IV—IV and V—V in FIG. 3 to show the state before forming the second metal wiring layer. FIG. 6 is a plan view showing the state after the second metal wiring layer is completed, and FIGS. 7 and 8 are sectional views taken along the lines VII—VII and VIII—VIII in FIG. 6, respectively.

In a two layer metal wiring structure shown in FIGS. 3 to 8, reference numeral 11 depicts a semiconductor substrate of a semiconductor integrated circuit, numeral 12 denotes a first insulating film layer of silicon oxide or silicon nitride formed on the semiconductor substrate 11, numeral 13 designates a first metal wiring layer of aluminum formed selectively with a predetermined lattice pattern on the first insulating film layer 12, and numeral 14 indicates a second insulating film layer of silicon oxide or silicon nitride covering the first metal wiring layer 13. Numeral 15 illustrates a second metal wiring layer of aluminum, which is selectively formed on the second insulating film layer 14 with a predetermined lattice pattern orthogonal to the pattern of the first layer 13 and connected to the first metal wiring layer 13 via through-holes 16 at predetermined portion thereof. Numeral 17 depicts wiring lattice lines for the second metal wiring layer 15, numeral 18 denotes through-holes for connecting wirings between the metal wirings 13 and 15 of the upper layer and the lower layer, and numeral 19 designates through-hole connecting wirings between the individual portions of the lower wiring layer 13.

In the two layered metal wiring structure of this embodiment shown in FIGS. 3 to 5, the first insulating film layer 12 is first formed on the semiconductor substrate 11, and contact holes are then perforated in the first insulating film layer 12 to contact it with terminals of circuit elements such as transistors formed in the main surface of the semiconductor substrate 11.

Then, the circuit elements are contacted with predetermined portions of the layer 12 via the through-holes formed in the first insulating film layer 12, and wiring segments of the first metal wiring layer 13 and formed by cutting the latter in rectangular shape so that these segments are in parallel as predetermined at every crossing portion of the second metal wiring layer 15 with the wiring lattice lines 17.

Further, after the second insulating film layer 14 is formed over the respective crossing portions, the throughholes 16 are perforated in the second insulating film layer 14 between the individual segments of the first metal layer 13 in row, (i.e. at the portions not crossing with the wiring lattice lines 17) to expose both ends of the respective segments of the first metal layer 13 the resulting exposed ends form contacts between the first metal wiring layer 13 and the second metal wiring layer 15 formed next and between adjacent segments of the first metal wiring layer 13 at necessary positions.

More specifically, the segments of the first metal wiring layer 13 formed on the first insulating film layer 12 as described above are regularly aligned therefor with each other at the required positions and are exposed at both cut ends thereof through the through-holes 16 of the second insulating film layer 14.

Further, the length of each segment of the first metal wiring layer 13 in the row direction (and hence the axial length of the second metal wiring layer 15 formed next perpendicularly to the wiring lattice line 17) is selected such that the second metal wiring layer 15 is not connected via the through-holes 16 with the first layer metal wiring 13 when the layer 13 is formed in a direction crossing the second metal wiring 15.

Figure 1:
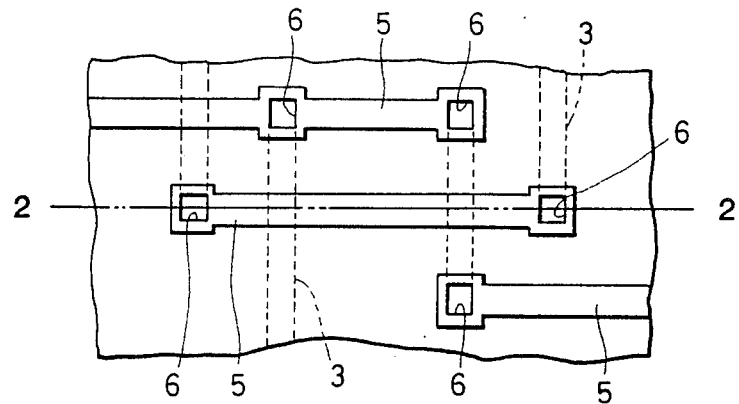
FIG. 1 is a plan view of the second layer metal wiring structure of a conventional integrated circuit device.
Figure 2:
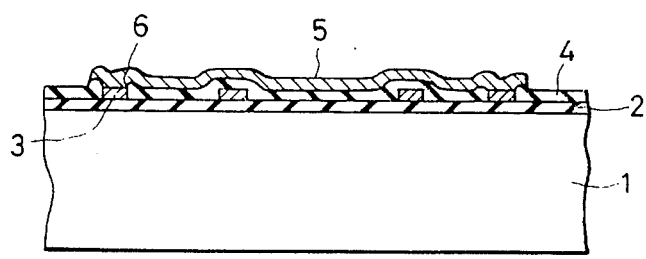
FIG. 2 is a sectional view taken along the line II—II of FIG. 1.

Then, the wiring lattice of the second metal wiring layer 15 is formed, along the wiring lattice lines 17, on the second insulating film layer 14 having the throughholes 16 as shown in FIGS. 6 to 8. The configuration of the second layer 15 is shown correspondingly to the conventional one shown in FIGS. 1 and 2.

In other words, in forming the wiring lattice of the second metal wiring layer 15, connecting wirings 18 which are continuous at predetermined portions to the second metal wiring layer 15, are used to fill all of the through-holes 16 (corresponding to portion A in FIGS. 6 and 8) or a portion thereof (corresponding to portion B in FIGS. 6 and 8) as required so that either one or both of the exposed ends of the segments of the first metal wiring layer 13 are connected to each other by the wirings 18 to connect the metal wiring layer 13 to the layer 15 in those portions.

Simultaneously, the entire portion of the throughhole 16 (shown by a portion to C in FIG. 8) is filled with connecting wiring 19 (which is provided and is not connected to the second metal wiring layer 15) to connect exposed ends of the segments of the first metal wiring layer so that the segments of the first metal wiring layer 13 can be connected mutually without short-circuiting with the second metal wiring layer –15– thereby elongate the length of desired portion of the first metal wiring layer 13 arbitrarily.

Therefore, in the embodiment described above, the wiring structure equivalent to the two metal wiring layers can be obtained by merely forming the single second metal wiring layer by using a single customizing mask after the formation of the first metal wiring layer.

In the embodiment described above, the metal wiring structure composed of the first layer (lower layer) and the second layer (upper layer) has been described. However, this invention is not limited to the particular embodiment. For example, the present invention can also be applied substantially similarly to the case of the wiring structure having more than two layers. In the wiring structure of the embodiment described above, the metal layers have been used as both of the first layer (lower layer) and the second layer (upper layer). However, it is possible to use, for example, a metal layer for either layer and a diffused layer or polysilicon layer for the other layer, particularly the first layer (lower layer). Further, although in the wiring structure of the embodiment described above the width of the through-hole is selected as being narrower than that of the first metal wiring layer (lower layer), it may be possible to make the width of the through-hole greater than that of the first metal wiring layer (lower layer).

According to the present invention, since the semiconductor structure having a common wiring region such as a gate array is constructed so that the wiring lattices of the lower wiring layer are cut into segments at intermediate portions between the wiring lattices of the upper wiring layer ends of the segments of the lower wiring layer are exposed through through-holes formed in the portions of the insulating film thereon other than at the crossing points of the wiring lattices of the upper and lower wiring layers though-holes in predetermined portions are then buried with a predetermined connecting wiring at the time of forming the upper wiring layer to connect the wirings of the upper lower to the lower layer at desired points, and are buried with discretely provided connecting wirings to connect adjacent segments to one other at desired points.

Thus, wiring structure having functions equivalent to multilayered wirings can be simply and effectively obtained through only one step of forming the upper wiring layer and the semicustomized semiconductor device can therefore be customized with only one photomask.

What is claimed is:

1. A semiconductor integrated circuit structure comprising:
    a semiconductor substrate (11);
    a first insulating layer (12) provided on said substrate;
    a first wiring layer (13) disposed on said first insulating layer, said first wiring layer including a plurality of electrically isolated conductive segments each having a first end and a second end;
    a second insulating layer (14) disposed on said first wiring layer, said second insulating layer including means for defining plural openings each dimensioned and positioned so as to simultaneously contain a first end of one of said plurality of conductive segments and a second end of a further one of said plurality of conductive segments; and
    a second wiring layer (15) formed on said second insulating layer, said second wiring layer including plural planar conductors disposed on said second insulating layer and further including conductive material disposed within selected ones of said openings and not connected to any of said upper wiring layer conductors, said conductive material establishing an electrical connection between ends of different ones of said first wiring layer segments.

2. An integrated circuit structure as in claim 1 wherein said first wiring layer segments are dimensioned in the direction axial thereto such that second wiring layer conductors disposed so as to cross said first wiring layer segments are not connected to said first wiring layer segments by said conductive material.

3. An integrated circuit structure as in claim 1 wherein:
    said openings each have a width greater than the width of said first wiring layer segments.

4. An integrated circuit structure as in claim 1 wherein said first wiring layer segment ends adjoin one another at positions between adjacent second wiring layer conductors.

5. An integrated circuit as in claim 1 wherein said second wiring layer is formed using only a single photomask.

6. An integrated circuit structure as in claim 1 wherein:
    said substrate includes electronic devices formed therein; and
    said first insulating layer includes contact holes for establishing electrical connections between said first wiring layer and said electronic devices.

7. In a custom semiconductor integrated circuit device of the type including:
    a semiconductor substrate;
    a first insulating layer provided on said substrate;
    a first wiring layer disposed on said first insulating layer, said first wiring layer including a plurality of electrically isolated conductive segments each having a first end and a second end; and
    a second insulating layer disposed on said first wiring layer,
    an improvement comprising:
    means in said second insulating layer for defining at least one opening dimensioned and positioned so as to simultaneously contain a first end of one of said plurality of conductive segments and a second end of a further one of said plurality of conductive segments; and
    conductive material means disposed within said opening for electrically connecting said first and further conductive segments together.

* * * * *